(12) United States Patent
Yu

(10) Patent No.: US 6,617,709 B2
(45) Date of Patent: Sep. 9, 2003

(54) CONTROLLING DEVICE FOR A HEAT-DISSIPATING SYSTEM

(75) Inventor: Shou-Te Yu, Taoyuan (TW)

(73) Assignee: Delta Electronics, Inc., Taoyuan Sien (TW)

( * ) Notice: Subject to any disclaimer, the term of this patent is extended or adjusted under 35 U.S.C. 154(b) by 0 days.

(21) Appl. No.: 09/764,752

(22) Filed: Jan. 18, 2001

(65) Prior Publication Data

US 2002/0093250 A1 Jul. 18, 2002

(30) Foreign Application Priority Data

Nov. 10, 2000 (TW) .................................... 89124008 A

(51) Int. Cl.[7] .............................................. H01H 35/00
(52) U.S. Cl. ........................ 307/119; 388/804; 307/140
(58) Field of Search ................................ 307/119, 117, 307/122, 139, 140; 388/804, 805

(56) References Cited

U.S. PATENT DOCUMENTS

| | | | | | |
|---|---|---|---|---|---|
| 4,841,207 A | * | 6/1989 | Cheyne | ....................... | 388/811 |
| 4,991,098 A | * | 2/1991 | Dantzler | ....................... | 701/1 |
| 5,621,159 A | * | 4/1997 | Brown et al. | ..................... | 73/9 |
| 5,942,866 A | * | 8/1999 | Hsieh | ........................ | 318/254 |
| 5,952,798 A | * | 9/1999 | Jones et al. | ................. | 318/138 |
| 5,962,933 A | * | 10/1999 | Henderson et al. | ......... | 307/126 |
| 5,990,582 A | * | 11/1999 | Henderson et al. | ......... | 307/139 |
| 6,037,732 A | * | 3/2000 | Alfano et al. | ................ | 318/471 |
| 6,075,329 A | * | 6/2000 | Liao et al. | ................... | 318/268 |
| 6,135,718 A | * | 10/2000 | Yang | .......................... | 318/471 |
| 6,182,902 B1 | * | 2/2001 | Shih | .......................... | 165/299 |
| 6,236,175 B1 | * | 5/2001 | Mourad et al. | ............. | 318/268 |
| 6,239,991 B1 | * | 5/2001 | Ajro et al. | ..................... | 363/41 |
| 6,247,898 B1 | * | 6/2001 | Henderson et al. | ............ | 417/3 |
| 6,392,372 B1 | * | 5/2002 | Mays, II | ..................... | 318/138 |

OTHER PUBLICATIONS

Modern Dictionary of Electronics, 7th Edition, 1999, Newnes (Butterworth–Heinemann Publications), p. 725.*

* cited by examiner

Primary Examiner—Brian Sircus
Assistant Examiner—Sharon A. Polk
(74) Attorney, Agent, or Firm—Thomas, Kayden, Horstemeyer & Risley

(57) ABSTRACT

A controlling device adapted to be used for a heat-dissipating device. The controlling device includes a signal generator electrically connected between the heat-dissipating device and a power source supplying a voltage for the heat-dissipating device, and generating a control signal for switching on/off the power source, and a voltage regulator electrically connected between the heat-dissipating device and the power source and connected in parallel with the signal generator for continuously providing the heat-dissipating device with a basic voltage when the power source is switched off by the control signal so as to prevent that an output signal of an external device electrically connected with the heat-dissipating device is interfered with the control signal.

21 Claims, 4 Drawing Sheets

CONTROLLING DEVICE FOR A HEAT-DISSIPATING SYSTEM

FIELD OF THE INVENTION

The present invention is related to a controlling device for a heat-dissipating system and especially to a pulse width modulation (PWM) control circuit for a direct-current (DC) fan.

BACKGROUND OF THE INVENTION

Please refer to FIG. 1 showing a conventional circuit for controlling the rotation speed of a fan 11 using a transistor 12 as a switch, wherein whether the voltage supply Vcc of DC fan is switched on or not is controlled directly by a pulse width modulation (PWM) signal for changing the rotation speed of fan. However, because the design of such a circuit is to directly control the voltage supply Vcc, some signals output by a frequency generator (FG) and a rotation speed detector (RD), both of which are electrically connected with the fan, are interfered with the PWM signal. As shown in FIG. 2, under the normal condition, the FG signal representative of the rotation speed of fan has the waveform (a) shown in this figure, but it will become as the waveform (c) when it is interfered with the PWM signal having the waveform (b) so that the actual rotation speed of fan is unable to be detected accurately. Likewise, referring to FIG. 3, the RD signal for detecting the rotation speed of fan is at a relatively low voltage level under the normal condition (shown as the waveform (1)) and will be changed from the relatively low voltage level to the relatively high voltage level only under an abnormal condition. Nevertheless, if the voltage supply of a fan is directly controlled by the PWM signal, the RD signal will become as the waveform (3) under the normal condition due to the interference of the PWM signal (shown as the waveform (2)). Because either the FG signal or the RD output signal is interfered with the PWM signal, the actual rotation speed of fan can not be detected out accurately.

In addition, the switched interval of the transistor 12 is changed along with the variation of a duty cycle of the PWM signal to control the average current supplied for the fan 11. However, if it is desired to drive the fan, the duty cycle of the PWM signal input into the transistor must be limited within a certain range enough to allow the fan to rotate, especially more than 30%.

SUMMARY OF THE INVENTION

The object of the present invention is to provide a heat-dissipating system with the signals of frequency generator or rotation speed detector immune from interference with the pulse width modulation signal used for controlling the rotation speed of the DC fan.

The present invention provides a controlling device adapted to be used for a heat-dissipating device. The controlling device includes a signal generator electrically connected between the heat-dissipating device and a power source supplying a voltage for the heat-dissipating device, and generating a control signal for switching on/off the power source, and a voltage regulator electrically connected between the heat-dissipating device and the power source and connected in parallel with the signal generator for continuously providing the heat-dissipating device with a basic voltage when the power source is switched off so as to prevent that an output signal of an external device electrically connected with the heat-dissipating device is interfered with the control signal.

The present invention provides another heat-dissipating system. The system includes a power supply, a DC fan, a pulse width modulation circuit generating a pulse width modulation signal, a transistor having a drain connected to the power supply, a gate connected to receive the pulse width modulation signal and a source connected to the DC fan, and a zener diode connected between the power supply and the DC fan, wherein the power supply provides a voltage to the DC fan through the zener diode when the transistor is turned off by the pulse width modulation signal, which prevents the output signal of the external device from interference.

The present invention further provides another heat-dissipating system. The system includes a power supply, a DC fan, a pulse width modulation circuit generating a pulse width modulation signal, a transistor having a drain connected to the power supply, a gate connected to receive the pulse width modulation signal and a source connected to the DC fan, and a resistor connected between the power supply and the DC fan, wherein the power supply provides a voltage to the DC fan through the zener diode when the transistor is turned off by the pulse width modulation signal, which prevents the output signal of the external device from interference.

The present invention may best be understood through the following description with reference to the accompanying drawings, in which:

DETAILED DESCRIPTION OF THE PREFERRED EMBODIMENT

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

Figure 1:
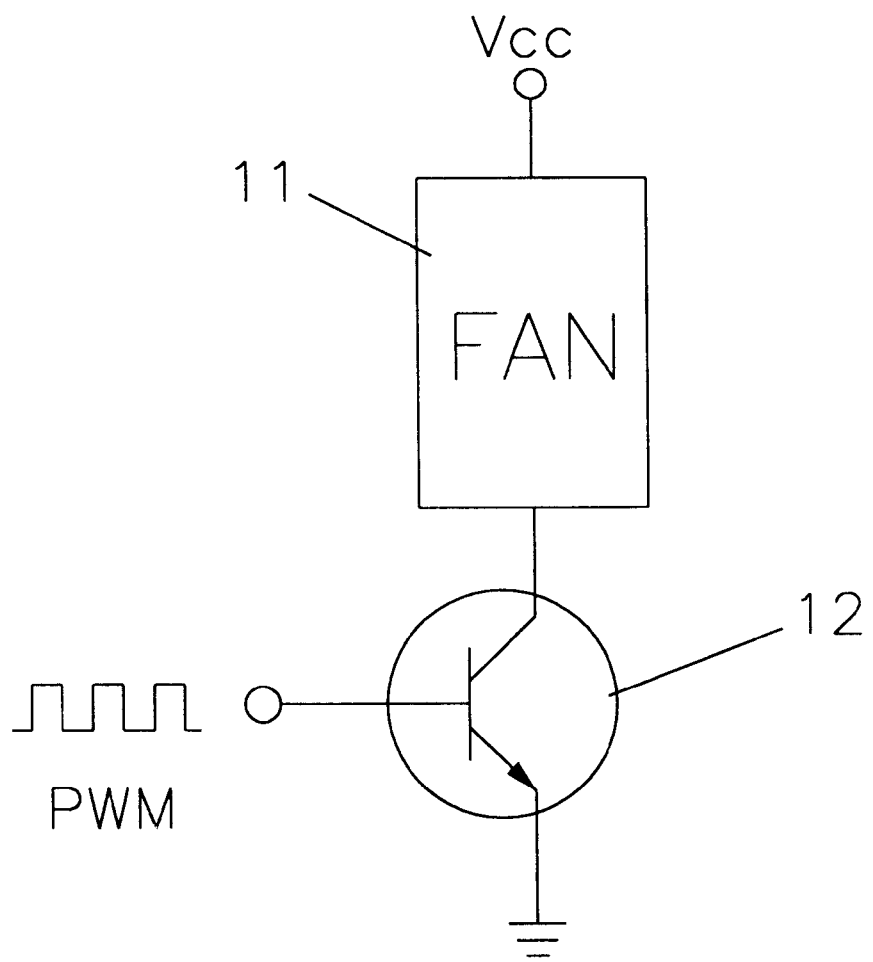
FIG. 1 is a schematic diagram showing a conventional control circuit of pulse width modulation (PWM) for a direct-current (DC) fan.
Figure 2:
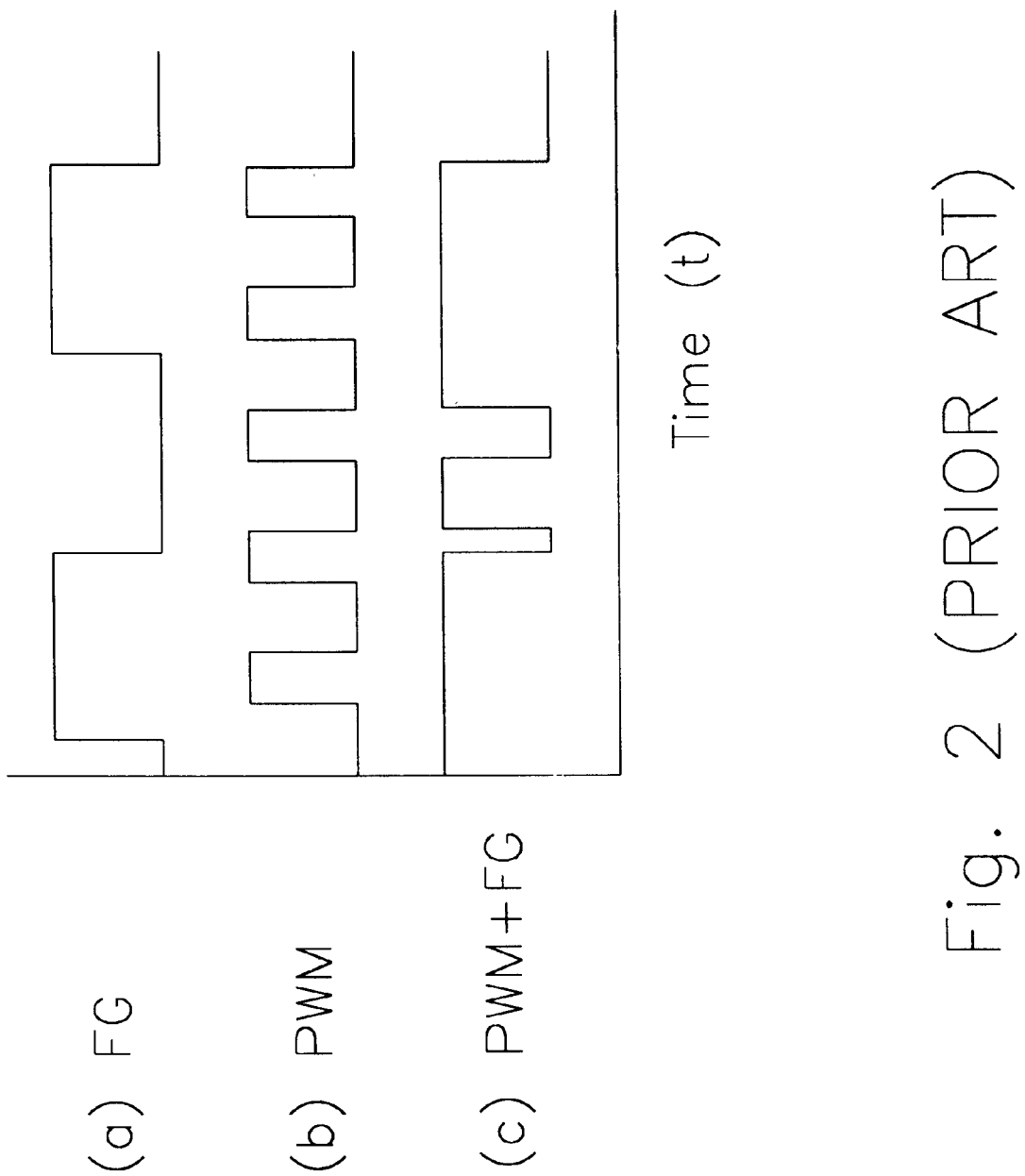
FIG. 2 shows the situation that the output signal of the frequency generator electrically connected with the fan is interfered with the PWM signal output by the conventional PWM control circuit.
Figure 3:
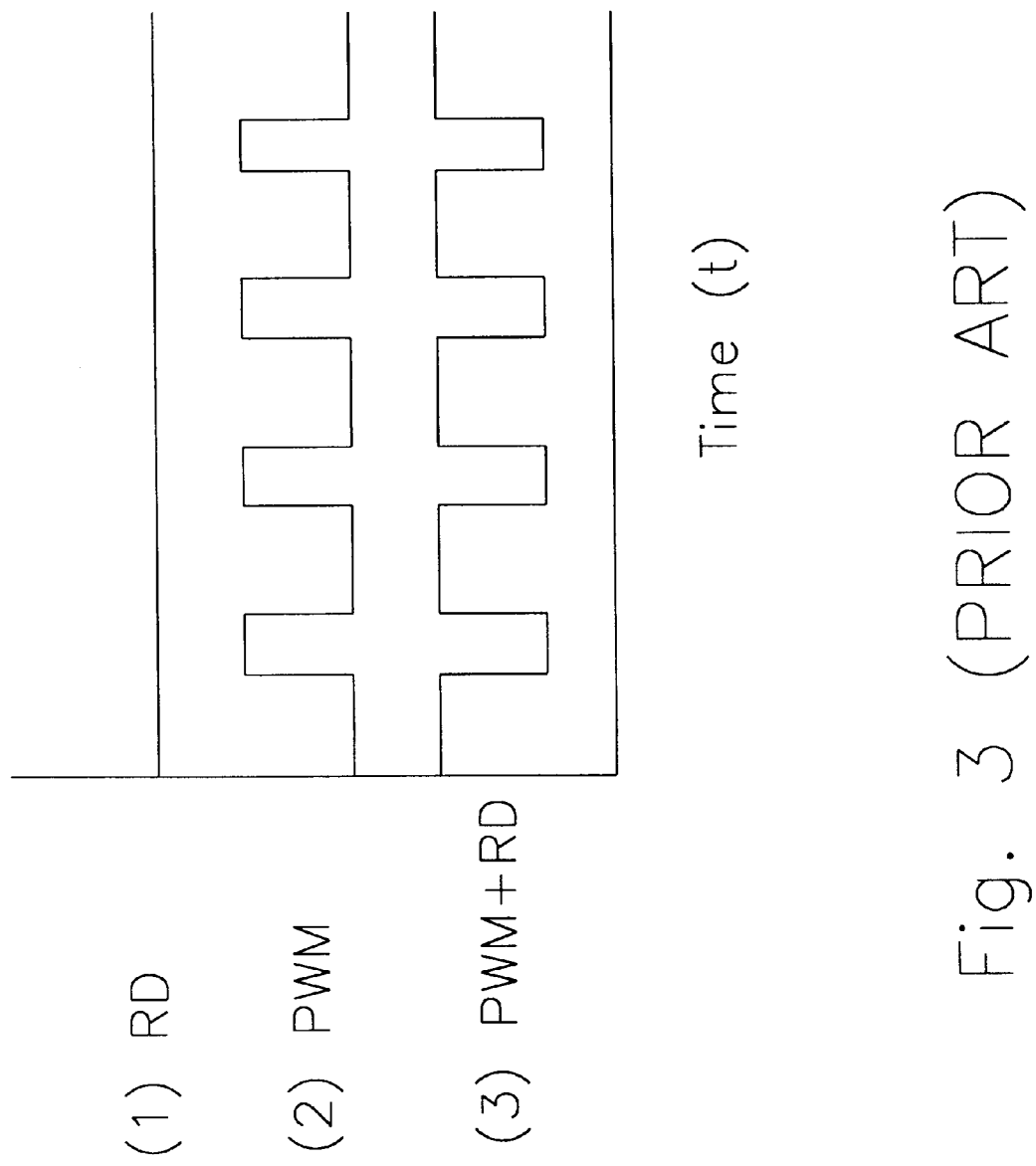
FIG. 3 shows the situation that the output signal of the rotation speed detector electrically connected with the fan is interfered with the PWM signal output by the conventional PWM control circuit.
Figure 4:
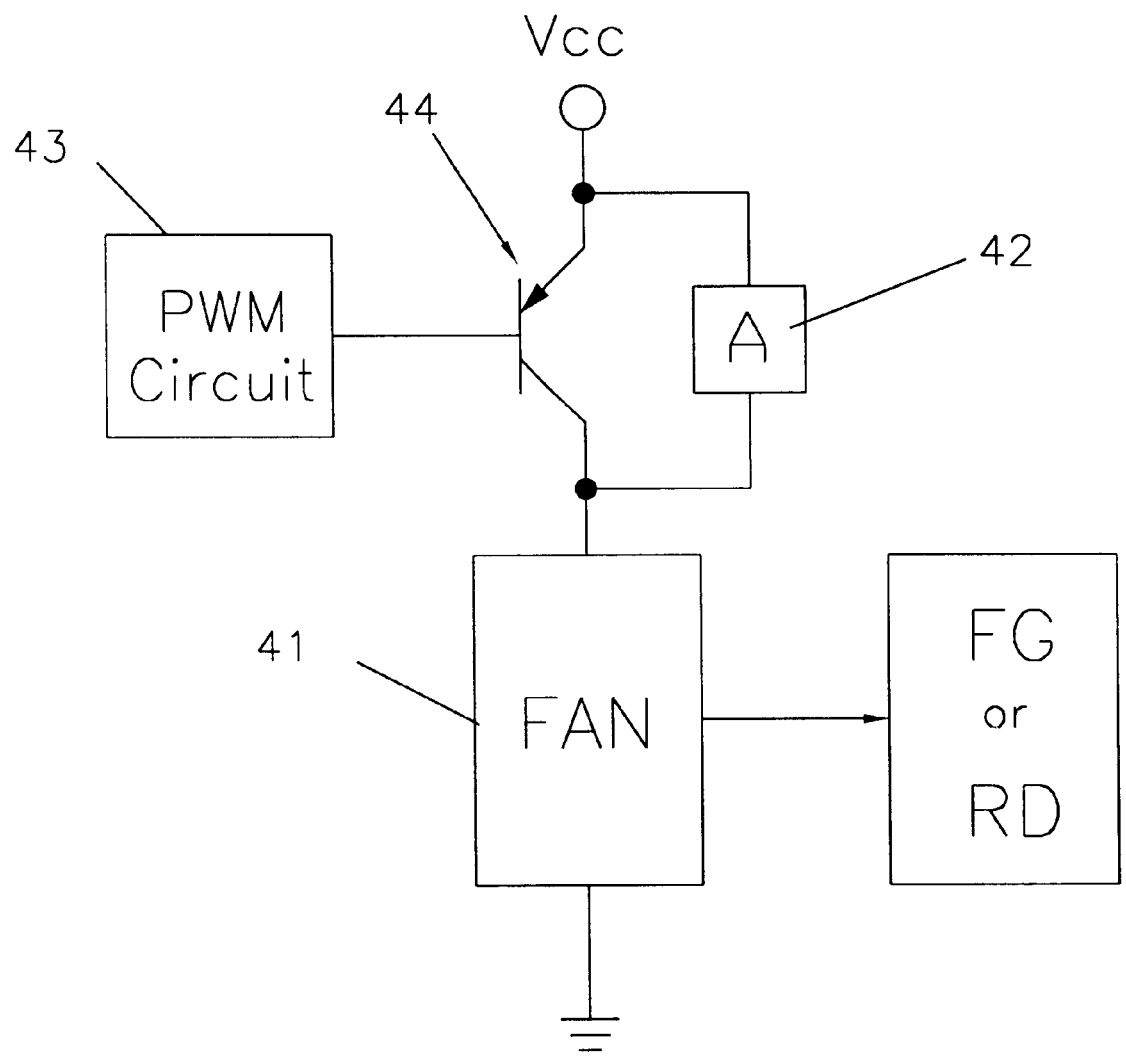
FIG. 4 is a schematic diagram showing a preferred embodiment of the controlling device for a heat-dissipating system according to the present invention.

FIG. 4 is a diagram showing a heat-dissipating system according to one embodiment of the invention. The system includes a signal generator 43, a VCC power supply, a switch 44, a voltage regulator 42, a DC fan 41 and a frequency generator 45. The signal generator 43 is a pulse width modulation circuit generating a pulse width modulation signal used as a control signal of the switch 44. The switch 44 is a transistor having a drain connected to the VCC power supply, a gate connected to receive the pulse width modulation signal from the signal generator 43 and a source connected to the DC fan 41. The voltage regulator 42 is a zener diode or resistor connected between the VCC power supply and the DC fan 41. The DC fan 41 is power supplied by the voltage VCC when the switch 44 is opened (the transistor is turned on) by the pulse width modulation signal and power supplied by a voltage from the voltage regulator 42 when the switch 44 is closed (the transistor is turned off) by the pulse width modulation signal. The voltage from the voltage regulator 42 is lower than the voltage VCC and the difference between them is the voltage drop on the zener diode or resistor used as the voltage regulator 42. The frequency generator 45 generates a square wave signal representing a rotation speed of the DC fan 41. The average current flowing through the DC fan 41 results the rotation of the DC fan 41 and varies with the duty cycle of the pulse width modulation signal. The duty cycle of the pulse width modulation signal is determined by the square wave signal generated by the frequency generator 45. Thus, with the feedback of the frequency generator 45, the rotation of the DC fan 41 can be kept at a desired speed.

It is noted that the voltage regulator 42 continuously provides the voltage to the DC fan 41 even when the switch 44 is closed by the pulse width modulation signal to isolate the DC fan 41 from the VCC power supply. The voltage regulator 42 induces an offset average current flowing through the DC fan 41, which keeps the DC fan 41 always running. This prevents the square wave signal of the frequency generator 45 from being interfered by the pulse width modulation signal. Accordingly, the rotation speed of the DC fan 41 can be precisely obtained using the frequency generator 45. This also results in a duty cycle of the pulse width modulation ranging from 0% to 100%.

The DC fan 41 may be connected with a rotation speed detector instead of the frequency generator 45. Similarly, the RD signal output by the detector is prevented from being interfered by the pulse width modulation signal. The voltage level of the RD signal stays at logic low when the DC fan 41 is running at a normal speed and rises to logic high only when the rotation speed is abnormal. Therefore, the rotation speed of the DC fan 41 can be precisely detected using the rotation speed detector. This also results in a duty cycle of the pulse width modulation ranging from 0% to 100%.

In conclusion, the present invention provides a heat-dissipating system in which the signals of the frequency generator or rotation speed detector are immune from interference from the pulse width modulation signal used for controlling the rotation speed of the DC fan. The duty cycle of the pulse width modulation signal ranges from 0% to 100%.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating system comprising:
   a power supply;
   a DC fan;
   a pulse width modulation circuit generating a pulse width modulation signal;
   a transistor having a drain connected to the power supply, a gate connected to receive the pulse width modulation signal and a source connected to the DC fan;
   a zener diode connected between the power supply and the DC fan; and
   an external device connected to the DC fan and generating an output signal;
   wherein the power supply provides a voltage to the DC fan through the zener diode when the transistor is turned off by the pulse width modulation signal, which prevents the output signal of the external device from interference.

2. The heat-dissipating system as claimed in claim 1, wherein a duty cycle of the pulse width modulation signal ranges from 0% to 100%.

3. The heat-dissipating system as claimed in claim 1 further comprising a detector detecting a rotation speed of the DC fan.

4. The heat-dissipating system as claimed in claim 1 further comprising a frequency generator for generation of a square wave signal representing a rotation speed of the DC fan.

5. A heat-dissipating system comprising:
   a power supply;
   a DC fan;
   a pulse width modulation circuit generating a pulse width modulation signal;
   a transistor having a drain connected to the power supply, a gate connected to receive the pulse width modulation signal and a source connected to the DC fan;
   a resistor connected between the power supply and the DC fan; and
   an external device connected to the DC fan and generating an output signal;
   wherein the power supply provides a voltage to the DC fan through the resistor when the transistor is turned off by the pulse width modulation signal, which prevents the output signal of the external device from interference.

6. The heat-dissipating system as claimed in claim 5, wherein a duty cycle of the pulse width modulation signal ranges from 0% to 100%.

7. The heat-dissipating system as claimed in claim 5 further comprising a detector detecting a rotation speed of the DC fan.

8. The heat-dissipating system as claimed in claim 5 further comprising a frequency generator for generation of a square wave signal representing a rotation speed of the DC fan.

9. A controlling device adapted to be used for a heat-dissipating device, comprising:
   a signal generator electrically connected between said heat-dissipating device and a power source supplying a voltage for said heat-dissipating device, and generating a control signal for switching on/off said power source; and
   a voltage regulator electrically connected between said heat-dissipating device and said power source and connected in parallel with said signal generator for continuously providing said heat-dissipating device with a basic voltage when said power source is switched off by said control signal so as to prevent that an output signal of an external device electrically connected with said heat-dissipating device is interfered with said control signal.

10. The controlling device according to claim 9, wherein said heat-dissipating device is a direct-current (DC) fan.

11. The controlling device according to claim 9, wherein said signal generator is a pulse width modulation (PWM) circuit.

12. The controlling device according to claim 11 further comprising an electronic switch electrically connected between said power source and said heat-dissipating device and connected with said PWM circuit for receiving said pulse width modulation signal and controlling a rotation speed of said heat-dissipating device corresponding to said duty cycle of said pulse width modulation signal.

13. The controlling device according to claim 12, wherein said electronic switch is a transistor.

14. The controlling device according to claim 9, wherein said control signal is a pulse width modulation (PWM) signal.

15. The controlling device according to claim 14, wherein a duty cycle of said pulse width modulation signal ranges from 0% to 100%.

16. The controlling device according to claim 9, wherein said voltage regulator is a zener diode.

17. The controlling device according to claim 9, wherein said voltage regulator is a resistor.

18. The controlling device according to claim 9, wherein said voltage regulator is a voltage source which supplies a voltage lower than said voltage supplied by said power source.

19. The controlling device according to claim 9, wherein said voltage regulator is a circuit which provides an internal circuit in said heat-dissipating device with a basic voltage.

20. The controlling device according to claim 9, wherein said external device electrically connected with said heat-dissipating device includes a detector for detecting a rotation speed of said heat-dissipating device.

21. The controlling device according to claim 9, wherein said external device electrically connected with said heat-dissipating device includes a frequency generator for generating a square-wave signal representative of a rotation speed of said heat-dissipating device.

* * * * *